(12) United States Patent
Zenzai

(10) Patent No.: US 12,243,689 B2
(45) Date of Patent: Mar. 4, 2025

(54) CHIP CERAMIC ELECTRONIC COMPONENT AND METHOD FOR MANUFACTURING THE SAME

(71) Applicant: Murata Manufacturing Co., Ltd., Nagaokakyo (JP)

(72) Inventor: Kota Zenzai, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 697 days.

(21) Appl. No.: 17/405,064

(22) Filed: Aug. 18, 2021

(65) Prior Publication Data
US 2021/0375545 A1    Dec. 2, 2021

Related U.S. Application Data

(63) Continuation of application No. PCT/JP2020/008132, filed on Feb. 27, 2020.

(30) Foreign Application Priority Data
Mar. 28, 2019    (JP) .................................. 2019-062901

(51) Int. Cl.
*H01G 4/12*    (2006.01)
*H01G 4/232*    (2006.01)
(Continued)

(52) U.S. Cl.
CPC .................. *H01G 4/12* (2013.01); *H01G 4/30* (2013.01); *H01L 28/60* (2013.01); *H01G 4/1227* (2013.01); *H01G 4/2325* (2013.01)

(58) Field of Classification Search
CPC .......... H01G 4/12; H01G 4/30; H01G 4/1209; H01G 4/2325; H01G 13/006; H01G 4/1227; H01L 28/60
See application file for complete search history.

(56) References Cited

U.S. PATENT DOCUMENTS

| | | | |
|---|---|---|---|
| 2011/0141657 A1* | 6/2011 | Jeon | H01G 4/2325 361/321.1 |
| 2014/0022691 A1* | 1/2014 | Kwag | H01G 4/12 361/301.4 |

(Continued)

FOREIGN PATENT DOCUMENTS

| | | |
|---|---|---|
| JP | 05-290622 A | 11/1993 |
| JP | 2009-283744 A | 12/2009 |

(Continued)

OTHER PUBLICATIONS

Office Action in CN202080024137.4, mailed Jul. 5, 2022, 9 pages.
(Continued)

*Primary Examiner* — Patricia D Valenzuela
(74) *Attorney, Agent, or Firm* — Keating & Bennett, LLP

(57) ABSTRACT

A method for manufacturing a chip ceramic electronic component that includes an outer electrode including a glass-free sintered layer including no glass. A glass-free conductive paste including a nickel powder, a metal powder, such as tin, having a melting point of lower than about 500° C., and a thermosetting resin, and not including glass, is applied to cover a portion of a surface of a ceramic body. The ceramic body to which the glass-free conductive paste has been applied is subjected to a heat treatment at a temperature higher than or equal to a temperature about 400° C. higher than the curing temperature of the thermosetting resin. The thermosetting resin is thermally decomposed or burned such that little or none remains, and the nickel powder and metal powder having a melting point of lower than about 500° C. are sintered to form a unified sintered metal body.

7 Claims, 3 Drawing Sheets

(51) Int. Cl.
    *H01G 4/30*      (2006.01)
    *H01L 49/02*     (2006.01)

(56)           References Cited

U.S. PATENT DOCUMENTS

2016/0020028  A1    1/2016   Katsuta
2018/0162780  A1    6/2018   Kaneda et al.
2018/0233289  A1    8/2018   Nagai et al.

FOREIGN PATENT DOCUMENTS

JP       2015-109411  A      6/2015
JP       2018-098327  A      6/2018
KR       1020190004631 A     1/2019
KR       1020190008406 A     1/2019

OTHER PUBLICATIONS

Second Office Action in CN202080024137.4, mailed Jan. 28, 2023, 7 pages.
Zenzai, "Chip Ceramic Electronic Component and Method for Manufacturing the Same", U.S. Appl. No. 18/625,324, filed Apr. 3, 2024.
Official Communication issued in International Patent Application No. PCT/JP2020/008132, mailed on Jun. 2, 2020.
Office Action in KR10-2021-7026670, mailed Sep. 19, 2022, 4 pages.

\* cited by examiner

CHIP CERAMIC ELECTRONIC COMPONENT AND METHOD FOR MANUFACTURING THE SAME

CROSS REFERENCE TO RELATED APPLICATIONS

This application claims the benefit of priority to Japanese Patent Application No. 2019-062901 filed on Mar. 28, 2019 and is a Continuation Application of PCT Application No. PCT/JP2020/008132 filed on Feb. 27, 2020. The entire contents of each application are hereby incorporated herein by reference.

BACKGROUND OF THE INVENTION

1. Field of the Invention

The present invention relates to a chip ceramic electronic component and a method for manufacturing the same, and in particular, to a structure of an outer electrode disposed on a surface of a ceramic body included in a chip ceramic electronic component and a method for forming an outer electrode.

2. Description of the Related Art

A problem that a chip ceramic electronic component, such as a multilayer ceramic capacitor, may encounter is the formation of cracks in a ceramic body due to the fact that the stress caused by the deflection of a substrate on which a chip ceramic electronic component is surface-mounted or the stress caused by heat applied in a solder reflow process used to mount the chip ceramic electronic component is applied to the ceramic body defining and functioning as the main body of the chip ceramic electronic component. Cracking the ceramic body not only impairs the function of the chip ceramic electronic component, but can also cause serious problems, such as electrical short-circuits.

As a countermeasure to the above-described problem, it has been reported that a resin electrode is used as an outer electrode of a chip ceramic electronic component, the resin electrode containing a conductive metal powder and a thermosetting resin, but not containing glass, the electrode being formed by thermally curing the thermosetting resin. When the resin electrodes are used, the following structures are used: (1) a structure in which a glass-containing sintered layer formed by applying a glass-containing conductive paste containing a metal powder and glass frit to a surface of a ceramic body and sintering the paste is formed as an underlying layer so as to be in contact with an inner conductor partially exposed on the surface of the ceramic body, and a resin electrode is formed thereon; and (2) a structure in which a resin electrode is formed on a surface of a ceramic body so as to be in direct contact with an inner electrode.

In either of the above structures (1) and (2), the stress that can cause cracks in the ceramic body is first absorbed by delamination starting from the resin electrode or by a fracture of the resin electrode itself. This enables the prevention of the formation of cracks in the ceramic body.

The above structure (2) is described in, for example, Japanese Unexamined Patent Application Publication No. 2009-283744. Japanese Unexamined Patent Application Publication No. 2009-283744 discloses that when a conductive paste containing a metal powder and a thermosetting resin is applied to a surface of a ceramic body and then the conductive paste is cured by heat treatment, the maximum temperature is set near the temperature at which the carbonization of the thermosetting resin is initiated (claim 3). Japanese Unexamined Patent Application Publication No. 2009-283744 states that setting the maximum temperature at the time of curing in this way facilitates the metal diffusion between the metal powder in the resin electrode and the metal of the inner conductor while the denseness of the resin electrode is maintained, thus ensuring the electrical connection between the resin electrode and the inner conductor, reducing a deterioration in insulation resistance in a high-temperature and high-humidity environment, and reducing variations in electrostatic capacitance when the structure is used for a multilayer ceramic capacitor (paragraph 0047).

The resin electrode, however, has a relatively high electrical resistance because its conductivity is obtained by dispersing a conductive metal powder in a thermosetting resin, and thus the chip ceramic electronic component tends to have a high equivalent series resistance (ESR). In particular, ESR in the above structure (1) is higher than that in the structure (2) because of the presence of glass on the surface layer of the glass-containing sintered layer defining and functioning as an underlying layer.

SUMMARY OF THE INVENTION

Preferred embodiments of the present invention provide chip ceramic electronic components each including an electrode layer having a lower electrical resistance than a resin electrode or a glass-containing sintered layer at an outer electrode while maintaining the function of protecting a ceramic body from cracking due to stress caused by deflection of a substrate or heat in a solder reflow process, and methods for manufacturing such chip ceramic electronic components.

A preferred embodiment of the present invention provides a method for manufacturing a chip ceramic electronic component. The chip ceramic electronic component manufactured by the manufacturing method according a preferred embodiment of the present invention includes a ceramic body including an inner conductor, a portion of the inner conductor being exposed on a surface of the ceramic body, and an outer electrode electrically coupled to the inner conductor and covering a portion of the surface of the ceramic body.

To manufacture the chip ceramic electronic component described above, a step of providing a ceramic body, a step of providing a conductive paste to be formed into at least a portion of the outer electrode, a step of applying the conductive paste to cover a portion of the surface of the ceramic body, and a step of subjecting the ceramic body to which the conductive paste has been applied to a heat treatment are performed.

The outer electrode includes a glass-free sintered layer including no glass. The step of providing the conductive paste includes a step of providing a glass-free conductive paste including a nickel powder, a metal powder having a melting point of lower than about 500° C., and a thermosetting resin, the glass-free conductive paste including no glass. The step of applying the conductive paste includes a step of applying the glass-free conductive paste to cover a portion of the surface of the ceramic body. The step of subjecting the ceramic body to a heat treatment includes a step of subjecting the ceramic body to which the glass-free conductive paste has been applied to a heat treatment at a temperature higher than or equal to a temperature about 400°

C. higher than the curing temperature of the thermosetting resin to form the glass-free sintered layer.

A preferred embodiment of the present invention provides a chip ceramic electronic component obtained by performing the manufacturing method described above.

A chip ceramic electronic component according to a preferred embodiment of the present invention includes a ceramic body including an inner conductor a portion of the inner conductor being exposed on a surface of the ceramic body and an outer electrode electrically coupled to the inner conductor and covering a portion of the surface of the ceramic body. The outer electrode includes a glass-free sintered layer including nickel and a metal having a melting point of lower than about 500° C., the glass-free sintered layer including no glass, and a percentage of a thermosetting resin included in the glass-free sintered layer is about 1% or less in an area fraction in a cross section of the glass-free sintered layer.

According to preferred embodiments of the present invention, the outer electrodes of the chip ceramic electronic components each include the glass-free sintered layer. The glass-free sintered layer can have a lower electrical resistance than a resin-containing conductive layer including a conductive metal powder and a thermosetting resin. Unlike the glass-containing sintered layer formed by sintering a conductive paste including a metal powder and a glass, there is no glass precipitation on a surface layer of the glass-free sintered layer. Thus, ESR can be reduced, compared to a chip ceramic electronic component in which the main portion of an outer electrode includes only a resin-containing conductor layer or a glass-containing sintered layer.

Even when the stress caused by the deflection of a substrate on which chip ceramic electronic components are surface-mounted or the stress caused by heat applied in a solder reflow process used to mount the chip ceramic electronic components is applied to the ceramic body, the stress can be absorbed by delamination starting from the glass-free sintered layer or by a fracture of the glass-free sintered layer itself. This prevents the formation of cracks in the ceramic body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
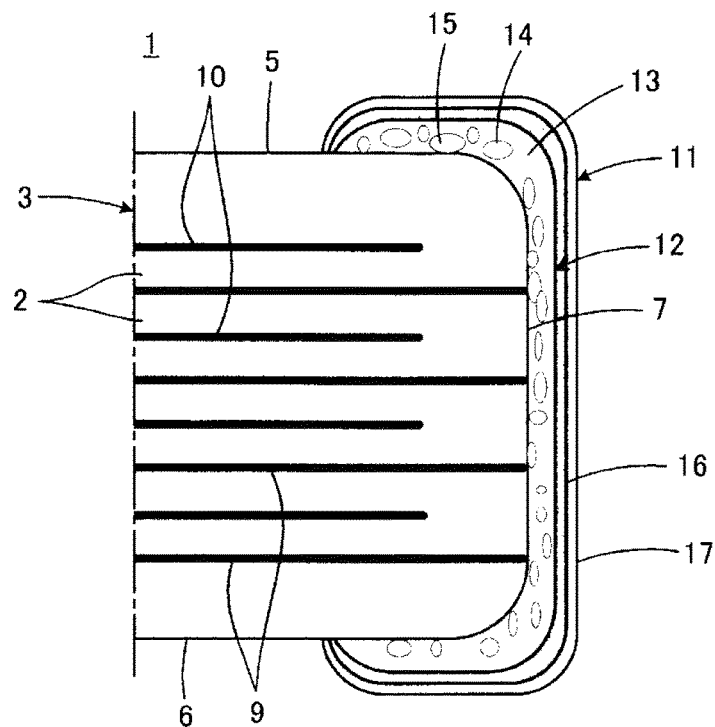
FIG. 1 is a cross-sectional view schematically illustrating a portion of a multilayer ceramic capacitor 1 as an example of a chip ceramic electronic component according to a first preferred embodiment of the present invention.

In the description of chip ceramic electronic components according to preferred embodiments of the present invention, multilayer ceramic capacitors are used as examples of the chip ceramic electronic components.

First Preferred Embodiment

A multilayer ceramic capacitor 1 as an example of a chip ceramic electronic component according to a first preferred embodiment of the present invention will be described below with reference to FIG. 1.

The multilayer ceramic capacitor 1 includes a ceramic body 3 in which multiple ceramic layers 2 made of a dielectric ceramic material are laminated. The ceramic body 3 includes a first main surface 5 and a second main surface 6 opposite each other, a first end surface 7 connecting them, a second end surface, not illustrated, opposite the first end surface 7, and a first side surface and a second side surface, not illustrated, that extend parallel or substantially parallel to the paper plane of FIG. 1 and are opposite each other.

Multiple first inner electrodes 9 and multiple second inner electrodes 10 defining and functioning as inner conductors are alternately arranged inside the ceramic body 3 in the lamination direction of the ceramic layers 2 with a ceramic layer 2 interposed between adjacent inner electrodes. The first inner electrodes 9 extend to the first end surface 7. An end edge of each of the first inner electrodes 9 is exposed at a surface of the ceramic body 3. The second inner electrodes 10 extend to the second end surface, which is not illustrated in FIG. 1. An end edge of each of the second inner electrodes 10 is exposed at a surface of the ceramic body 3. The inner electrodes 9 and 10 include a conductive component, such as nickel, for example.

The outer electrode illustrated, i.e., a first outer electrode 11, is disposed on the first end surface 7, which is a portion of the surface of the ceramic body 3, and electrically coupled to the first inner electrodes 9. A second outer electrode, which is not illustrated in the figure, opposite the first outer electrode 11 is disposed on the second end surface, which is a portion of the surface of the ceramic body 3, and electrically coupled to the second inner electrodes 10. The first outer electrode 11 and the second outer electrode have the same or substantially the same structure. Thus, the structure of the first outer electrode 11 will be described in detail below, and the description of the structure of the second outer electrode is omitted.

The first outer electrode 11 extends from the first end surface 7 to portions of the first and second main surfaces 5 and 6 and the first and second side surfaces adjacent to the first end surface 7. The outer electrode 11 is formed by performing a step of providing a conductive paste to be formed into at least a portion of the outer electrode, a step of applying the conductive paste to cover a portion of the surface of the ceramic body 3, and a step of subjecting the ceramic body 3 to which the conductive paste has been applied to heat treatment.

Here, the ceramic body 3 has already been sintered, and the step of subjecting the ceramic body 3 to which the conductive paste has been applied to a heat treatment is not for sintering the ceramic body 3, i.e., it is not for co-sintering the conductive paste and the ceramic body 3. This heat treatment is exclusively for sintering or curing the conductive paste.

In the present preferred embodiment, the outer electrode 11 includes a glass-free sintered layer 12 that includes nickel and a metal having a melting point of lower than about 500° C. and does not include glass. The glass-free sintered layer 12 is provided on a portion of the surface of the ceramic body 3, i.e., the end surface 7, while in contact with the inner electrodes 9. To form the glass-free sintered layer 12, the step of providing the conductive paste includes a step of providing a glass-free conductive paste that includes a nickel powder, a metal powder having a melting point of lower than about 500° C., and a thermosetting resin and that does not include glass. The nickel powder has a melting point of about 500° C. or higher, for example.

As a metal included in the metal powder having a melting point of lower than about 500° C., for example, at least one of tin, a combination of tin and bismuth, and a combination of tin, silver, and copper is used.

According to experimental examples described below, when a tin powder is used as the metal powder having a melting point of lower than about 500° C., the volume of the tin powder is more preferably, for example, about 30% or more and about 70% or less based on the total volume of the nickel powder and the tin powder. The particles of each of the nickel powder and the metal powder having a melting point of lower than about 500° C. may have a spherical or plate shape. Each of the nickel powder and the metal powder having a melting point of lower than about 500° C. used is, for example, about 0.4 μm to about 1.1 μm in terms of D50.

Examples of the thermosetting resin that can be used include bisphenol A-type epoxy resins, resol-type phenolic resins, and novolac-type phenolic resins.

To the thermosetting resin, a solvent, such as, for example, diethylene glycol monobutyl ether or diethylene glycol monoethyl ether, is added.

For example, the metal powder accounts for about 50% to about 65% by volume of the total of the metal powder and the thermosetting resin (excluding the solvent).

The step of applying the conductive paste includes a step of applying, by a dipping method or the like, for example, the glass-free conductive paste to cover a portion of the surface of the ceramic body 3, i.e., the end surface 7, and to be in contact with the inner electrodes 9. After the application of the glass-free conductive paste, the paste is dried, for example, at about 150° C. The coating thickness on the end surface 7 of the ceramic body 3 is, for example, about 5 μm to about 30 μm after drying. The reason the coating thickness is in a wide range of, for example, about 5 μm to about 30 μm is that the coating thickness may vary among the multiple ceramic elements 3 and that the coating thickness on the end surface 7 of a single ceramic element 3 may vary from place to place.

The step of subjecting the ceramic body 3 to a heat treatment includes a step of subjecting the ceramic body 11 to which the glass-free conductive paste has been applied to the heat treatment at a temperature higher than or equal to a temperature about 400° C. higher than the curing temperature of the thermosetting resin to form the glass-free sintered layer 12. When the curing temperature of the thermosetting resin is about 180° C., the heat treatment is performed at a temperature of about 580° C. or higher, for example, about 850° C. The upper limit of the heat-treatment temperature is a temperature that does not adversely affect the ceramic body 3 and is preferably, for example, about 950° C.

As illustrated in FIG. 1, the glass-free sintered layer 12 formed as described above is mostly composed of a sintered metal body 13 in which a nickel powder and a metal powder having a melting point of lower than about 500° C., for example, a metal powder including tin, silver, and copper, are sintered into one piece. The sintered metal body 13 retains little or none of the original powder shape of the nickel powder and the metal powder. The glass-free sintered layer 12 has sufficient adhesion to the ceramic body 3. In the case where the inner electrodes 9 include, for example, nickel and where the sintered metal body 13 includes nickel, tin, and copper, these metals interdiffuse between the inner electrodes 9 and the glass-free sintered layer 12 to achieve a highly reliable bonding state. The inside of the sintered metal body 13 may include voids 14 and carbon 15 originating from the thermosetting resin as illustrated in FIG. 1.

As described above, when the metal powder that is included in the glass-free conductive paste and that has a melting point of lower than about 500° C. is a powder including tin, silver, and copper, the sintered metal body 13 includes nickel, tin, silver, and copper. When the metal powder having a melting point of lower than about 500° C. includes tin and bismuth, the sintered metal body 13 includes nickel, tin, and bismuth.

The glass-free conductive paste provided to form the glass-free sintered layer 12 includes no glass. Thus, the glass-free sintered layer 12 includes no glass. Unlike a glass-containing sintered layer, glass, which inhibits electrical continuity, is not precipitated on the surface layer, thus eliminating the cause of an increase in ESR of the multilayer ceramic capacitor 1.

The presence of the carbon 15 originating from the thermosetting resin and the absence of glass can be confirmed, for example, by producing a cross-section of the multilayer ceramic capacitor 1 using, for example, ion milling and conducting mapping analysis using SEM-EDX. That is, when the mapping analysis is performed with SEM-EDX, the carbon 15 originating from the thermosetting resin is detected inside the sintered metal body 13, and a glass component containing Si and B is not detected.

Although the glass-free conductive paste includes the thermosetting resin, the heat treatment at a temperature higher than or equal to a temperature about 400° C. higher than the curing temperature of the thermosetting resin enables the thermal decomposition or combustion of the thermosetting resin. Thus, none or very little of the thermosetting resin remains in the glass-free sintered layer 12. More specifically, the percentage of the thermosetting resin included in the glass-free sintered layer 12 is, for example, about 1% or less in area fraction in a cross section of the glass-free sintered layer 12.

The heat-treatment time and the oxygen concentration in the heat-treatment atmosphere are appropriately adjusted so as to provide the above-described state in the glass-free sintered layer 12.

Figure 5:
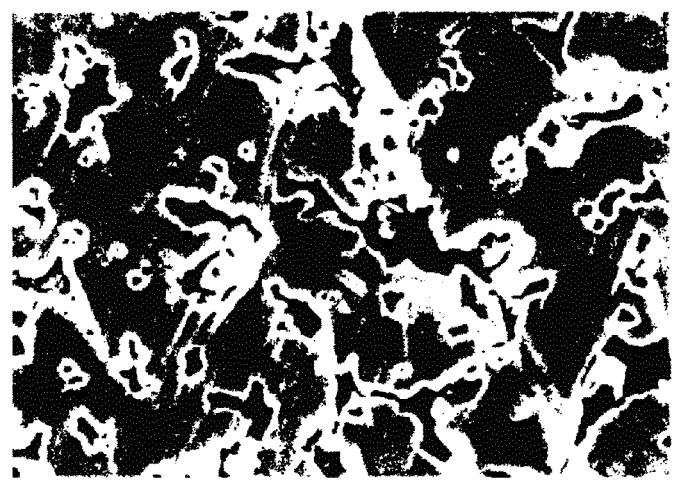
FIG. 5 illustrates a photomicrograph of a cross section of an actual sample of a glass-free sintered layer 12 of the multilayer ceramic capacitor 1 illustrated in FIG. 1.

FIG. 5 illustrates a photomicrograph of a cross section of an actual sample of the glass-free sintered layer 12 formed as described above. The sample illustrated in FIG. 5 is formed by a heat treatment of the glass-free conductive paste at about 850° C., the glass-free conductive paste including about 50% by volume of the nickel powder and about 50% by volume of a tin powder that is used as the metal powder having a melting point of lower than about 500° C. included in the glass-free conductive paste. In FIG. 5, it can be seen that the metal powders are sintered into one piece without maintaining their original shape.

Next, as illustrated in FIG. 1, a nickel plating film 16 covers the outer electrode 11 including the glass-free sintered layer 12, and then a tin plating film 17 is formed thereon.

As a modification of the first preferred embodiment described above, the coating thickness of the glass-free conductive paste to form the glass-free sintered layer 12 may be larger than that in the case of the first preferred embodiment, for example, about 30 μm to about 60 μm after drying, and then the same heat treatment as in the first preferred embodiment may be performed. In this case, in a portion of the glass-free sintered layer 12 near the interface with the ceramic body 3, a sintered metal body is formed while retaining the shape of the metal powders and a portion of the thermosetting resin. In the surface layer portion, a sintered metal body in which the metal powders are sintered into one piece is formed without maintaining the thermosetting resin.

Second Preferred Embodiment

Figure 2:
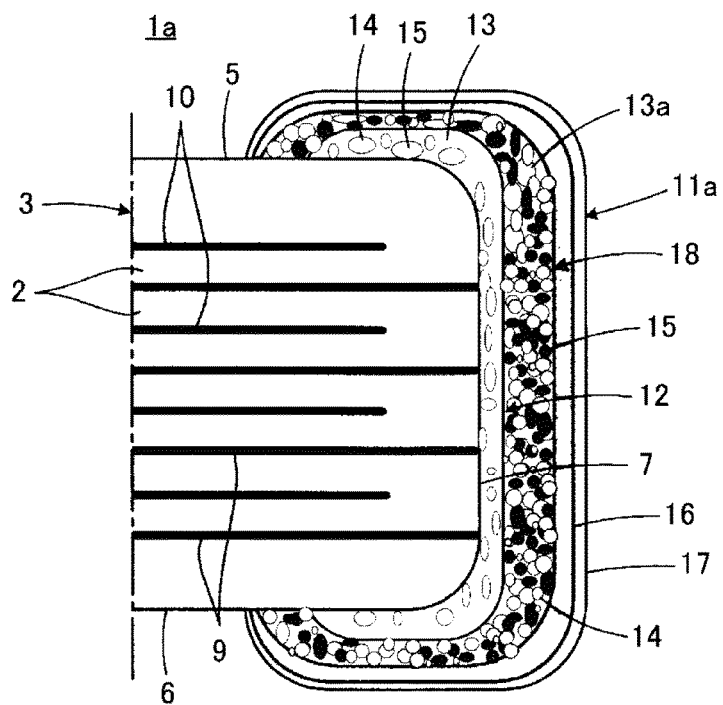
FIG. 2 is a cross-sectional view schematically illustrating a portion of a multilayer ceramic capacitor 1a as an example of a chip ceramic electronic component according to a second preferred embodiment of the present invention.

FIG. 2 is a cross-sectional view schematically illustrating a portion of a multilayer ceramic capacitor 1a as an example of a chip ceramic electronic component according to a second preferred embodiment of the present invention. In FIG. 2, elements corresponding to those illustrated in FIG. 1 are designated by the same reference numerals, and redundant descriptions are not repeated.

The following describes the different points of the second preferred embodiment from the first preferred embodiment.

In the multilayer ceramic capacitor 1a, when the glass-free sintered layer 12 is defined as a first glass-free sintered layer 12, an outer electrode 11a further includes a second glass-free sintered layer 18 including no glass, and the second glass-free sintered layer 18 is disposed on the first glass-free sintered layer 12.

To form the outer electrode 11a as described above, the following conductive pastes are provided: a first glass-free conductive paste for the first glass-free sintered layer 12, the first glass-free conductive paste including a nickel powder, a first metal powder having a melting point of lower than about 500° C., and a first thermosetting resin and including no glass, and in addition, a second glass-free conductive paste including a nickel powder, a second metal powder having a melting point of lower than about 500° C., and a second thermosetting resin and including no glass. The second glass-free conductive paste may have the same composition as the first glass-free conductive paste. In this case, it is possible to reduce the cost of the glass-free conductive paste and simplify the production control.

Next, as described in the first preferred embodiment, while in contact with the inner electrodes 9, the first glass-free conductive paste is applied onto the end surface 7 of the ceramic body 3 to a thickness of, for example, about 5 μm to about 30 μm after drying and then dried at about 150° C., for example. Subsequently, a heat treatment is performed at a higher temperature than that in the case of the first preferred embodiment, for example, about 900° C. to first form the first glass-free sintered layer 12.

A step of applying the second glass-free conductive paste onto the first glass-free sintered layer 12 and drying the paste, for example, at about 150° C. is performed. The coating thickness after drying is selected to be, for example, about 10 μm to about 40 μm at a portion covering the end surface 7 of the ceramic body 3.

The ceramic body 3 to which the second glass-free conductive paste has been applied is subjected to a heat treatment, thus forming the second glass-free sintered layer 18. At this time, the second glass-free sintered layer 18 is formed so as to have a lower degree of sintering than the first glass-free sintered layer 12. More specifically, the ceramic body 3 to which the second glass-free conductive paste has been applied is subjected to heat treatment at a second temperature that is a temperature higher than or equal to a temperature about 400° C. higher than the curing temperature of the second thermosetting resin and that is lower than the first temperature at which the first glass-free sintered layer 12 has been sintered.

For example, when a temperature of about 900° C. is used to sinter the first glass-free sintered layer 12, a temperature of, for example, about 600° C. is used to sinter the second glass-free sintered layer 18.

In the second glass-free sintered layer 18, the voids 14 and the carbon 15 originating from the thermosetting resin are present, and a sintered metal body 13a is present in which the nickel powder and the second metal powder having a melting point of lower than about 500° C. are partially unified while retaining their original shapes. As described above, when the metal powder that has a melting point of lower than about 500° C. and that is included in the second glass-free conductive paste is a powder including tin, silver, and copper, the sintered metal body 13a includes nickel, tin, and copper. When the metal powder having a melting point of lower than about 500° C. includes tin and bismuth, the sintered metal body 13a includes nickel, tin, and bismuth.

Figure 6:
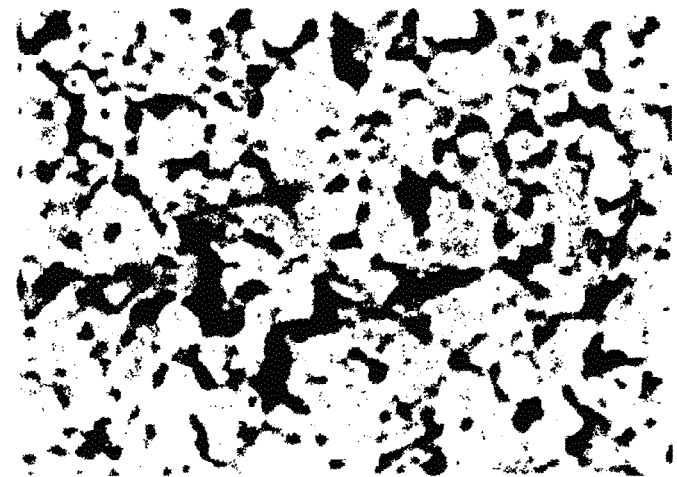
FIG. 6 illustrates a photomicrograph of a cross section of an actual sample of a second glass-free sintered layer 18 of the multilayer ceramic capacitor 1a illustrated in FIG. 2.

FIG. 6 illustrates a photomicrograph of a cross section of an actual sample of the second glass-free sintered layer 18 formed as described above. The sample illustrated in FIG. 6 is formed by a heat treatment of the second glass-free conductive paste at about 600° C., the second glass-free conductive paste including about 50% by volume of the nickel powder and about 50% by volume of a tin powder that is used as the metal powder having a melting point of lower than about 500° C. In FIG. 6, it can be seen that the nickel powder and the tin powder are sintered while partially retaining their original shapes, and are partially unified.

As in the case of the first preferred embodiment, the nickel plating film 16 is formed so as to cover the outer electrode 11a. More specifically, as illustrated in FIG. 2, the nickel plating film 16 is formed on the second glass-free sintered layer 18, and the tin plating film 17 is formed thereon.

Third Preferred Embodiment

Figure 3:
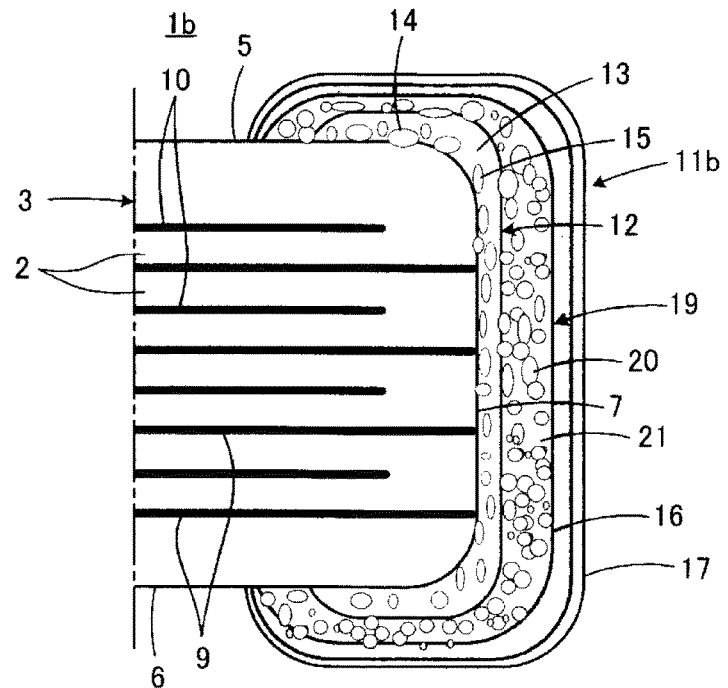
FIG. 3 is a cross-sectional view schematically illustrating a portion of a multilayer ceramic capacitor 1b as an example of a chip ceramic electronic component according to a third preferred embodiment of the present invention.

FIG. 3 is a cross-sectional view schematically illustrating a portion of a multilayer ceramic capacitor 1b as an example of a chip ceramic electronic component according to a third preferred embodiment of the present invention. In FIG. 3, elements corresponding to those illustrated in FIG. 1 are designated by the same reference numerals, and redundant descriptions are not repeated.

The following describes the different points of the third preferred embodiment from the first preferred embodiment.

In the multilayer ceramic capacitor 1b, an outer electrode 11b further includes a resin-containing conductive layer 19 disposed on the glass-free sintered layer 12.

To form the outer electrode 11b as described above, a third glass-free conductive paste is provided as a conductive paste, the third glass-free conductive paste including a conductive metal powder and a thermosetting resin and including no glass. As the conductive metal powder included in the third glass-free conductive paste, for example, a silver powder, a powder including silver and tin, a copper powder, or a powder including copper and tin can be used. As the thermosetting resin included in the third glass-free conductive paste, the same thermosetting resin as that included in the glass-free conductive paste provided in the first preferred embodiment can be used.

Next, as described in the first preferred embodiment, while in contact with the inner electrodes 9, the glass-free conductive paste for the glass-free sintered layer 12 is applied onto the end surface 7 of the ceramic body 3 to a thickness of, for example, about 5 µm to about 30 µm after drying, dried at, for example, about 150° C., and heat-treated, for example, at about 850° C. to first form the glass-free sintered layer 12.

A step of applying the third glass-free conductive paste onto the glass-free sintered layer 12 and drying the paste, for example, at about 150° C. is performed. The coating thickness after drying is selected to be, for example, about 10 µm to about 40 µm at a portion covering the end surface 7 of the ceramic body 3.

The ceramic body 3 to which the third glass-free conductive paste has been applied is subjected to a heat treatment, for example, at about 200° C. to heat-cure the thermosetting resin included in the third glass-free conductive paste, thus forming the resin-containing conductive layer 19 on the glass-free sintered layer 12. As illustrated in FIG. 3, the resin-containing conductive layer 19 is includes a thermosetting resin 21 in which a conductive metal powder 20 is dispersed.

As in the case of the first preferred embodiment, the nickel plating film 16 is formed so as to cover the outer electrode 11b. More specifically, as illustrated in FIG. 3, the nickel plating film 16 is formed on the resin-containing conductive layer 19, and the tin plating film 17 is formed thereon.

Fourth Preferred Embodiment

Figure 4:
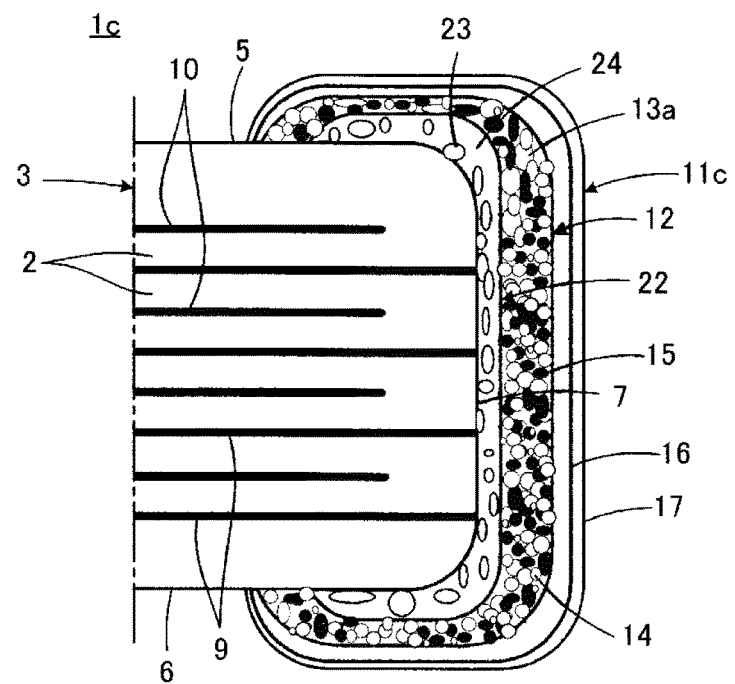
FIG. 4 is a cross-sectional view schematically illustrating a portion of a multilayer ceramic capacitor 1c as an example of a chip ceramic electronic component according to a fourth preferred embodiment of the present invention.

FIG. 4 is a cross-sectional view schematically illustrating a portion of a multilayer ceramic capacitor 1c as an example of a chip ceramic electronic component according to a fourth preferred embodiment of the present invention. In FIG. 4, elements corresponding to those illustrated in FIG. 1 are designated by the same reference numerals, and redundant descriptions are not repeated.

The following describes the different points of the fourth preferred embodiment from the first preferred embodiment.

In the multilayer ceramic capacitor 1c, an outer electrode 11c further includes a glass-containing sintered layer 22 disposed on the ceramic body 3 and the glass-free sintered layer 12 is disposed on the glass-containing sintered layer 22.

To form the outer electrode 11c as described above, a glass-containing conductive paste that will be formed into the glass-containing sintered layer 22 and that includes a metal powder and a glass is provided as a conductive paste. As the metal powder included in the glass-containing conductive paste, for example, a metal powder including copper is used.

Next, the glass-containing conductive paste is applied onto the first end surface 7 of the ceramic body 3 while in contact with the inner electrodes 9.

The ceramic body 3 to which the glass-containing conductive paste has been applied is subjected to a heat treatment. This results in the formation of the glass-containing sintered layer 22 in which the metal powder is sintered with the glass included. In the glass-containing sintered layer 22, a sintered metal body 24 including a glass 23 is formed.

A glass-free conductive paste including, for example, nickel, tin, and bismuth, similar to that used in the first preferred embodiment, is applied onto the glass-containing sintered layer 22 to a thickness of, for example, about 10 µm to about 40 µm after drying, dried at, for example, about 150° C., and then subjected to a heat treatment, for example, at about 600° C. to form the glass-free sintered layer 12. In this case, the heat treatment may be performed at, for example, about 850° C. as in the case of the first preferred embodiment. However, since the heat treatment is performed at about 600° C., which is lower than about 850° C., the degree of sintering is less. In the glass-free sintered layer 12, as in the case of the second glass-free sintered layer 18 in the second preferred embodiment, the voids 14 and the carbon 15 originating from the thermosetting resin are present, and in addition, the sintered metal body 13a is present in which the nickel powder and the metal powder having a melting point of lower than about 500° C. are partially unified while partially retaining their original shapes.

The nickel plating film 16 is formed on the glass-free sintered layer 12 so as to cover the outer electrode 11c formed in this way, and the tin plating film 17 is formed thereon.

Experimental Examples

The glass-free conductive pastes were provided, each of the glass-free conductive pastes being used for samples 1 to 7 and including a copper powder and a nickel powder in the proportions given in Table 1 below.

TABLE 1

| Sample No. | | 1 | 2 | 3 | 4 | 5 | 6 | 7 |
|---|---|---|---|---|---|---|---|---|
| Percentage by volume of metal | Nickel | 80 | 70 | 50 | 40 | 30 | 20 | 10 |
| | Tin | 20 | 30 | 50 | 60 | 70 | 80 | 90 |
| Composition of conductive paste [% by weight] | | | | | | | | |
| Nickel | | 56.4 | 50.2 | 37.1 | 30.2 | 23.0 | 15.6 | 8.0 |
| Tin | | 11.4 | 17.4 | 30.0 | 36.6 | 43.4 | 50.5 | 57.9 |
| Bisphenol A-type epoxy resin | | 5.1 | 5.1 | 5.3 | 5.4 | 5.5 | 5.6 | 5.7 |
| Novolac-type phenolic resin | | 2.7 | 2.7 | 2.8 | 2.9 | 2.9 | 3.0 | 3.0 |
| Diethylene glycol ethyl ether | | 24.4 | 24.6 | 24.8 | 24.9 | 25.2 | 25.3 | 25.4 |
| Adhesion of outer electrode | | | | | | | | |
| Connection to inner electrode | | ○ | ○ | ○ | ○ | ○ | ○ | ○ |
| Adhesion to ceramic body | | ○ | ○ | ○ | ○ | ○ | ○ | ○ |
| Sintering in outer electrode | | × | ○ | ○ | ○ | ○ | ○ | ○ |
| Ejection of metal ball | | ○ | ○ | ○ | ○ | ○ | × | × |
| Moisture resistance load reliability | | × | ○ | ○ | ○ | ○ | ○ | ○ |

Ceramic bodies having planar dimensions of about 1.0 mm×about 0.5 mm, including inner electrodes including nickel as a conductive component, and providing an electrostatic capacitance of about 2.2 µF were provided. The glass-free conductive pastes used for samples 1 to 7 were applied to the end surfaces of the respective ceramic bodies to a thickness of about 5 µm to about 30 µm after drying and dried at about 150° C.

The ceramic bodies to which the glass-free conductive pastes had been applied were subjected to a heat treatment at about 850° C. to form glass-free sintered layers that will be outer electrodes.

For the multilayer ceramic capacitors of samples 1 to 7 obtained as described above, as presented in Table 1, "Adhesion of outer electrode" was evaluated. More specifically, "Connection to inner electrode" and "Adhesion to ceramic body" were evaluated, and "Sintering in outer electrode" was evaluated in order to check the shape retainability of the outer electrodes. These evaluations were performed by processing the multilayer ceramic capacitor samples to provide cross sections using an ion milling apparatus and performing observation with SEM.

For "Connection to inner electrode", a sample in which nickel in the inner electrodes and the metals in the outer electrodes interdiffused was marked with "○", and a sample in which they did not interdiffuse was marked with "X".

For "Adhesion to ceramic body", a sample in which the ceramic body and the outer electrodes were in close contact with each other was marked with "○", and a sample in which they were not in close contact with each other was marked with "X".

For "Sintering in outer electrode", a sample in which the metal powders in the outer electrodes were sintered was marked with "○", and a sample in which they were not sintered was marked with "X".

Whether a molten metal was ejected from the outer electrodes to form ball-shaped foreign matter on the surfaces of the outer electrodes was assessed by visual observation. For "Ejection of metal ball", a sample in which the ejection of the molten metal occurred was marked with "X", and a sample in which it did not occur was marked with "○".

A moisture resistance load test was conducted on samples 1 to 7 including the glass-free sintered layers defining and functioning as the outer electrodes by applying a voltage of about 5 V to the samples for about 144 hours at a temperature of about 125° C. and a relative humidity of about 95% to evaluate "Moisture resistance load reliability". For "Moisture resistance load reliability", a sample in which the insulation resistance did not decrease was marked with "○", and a sample in which the insulation resistance decreased was marked with "X".

All of samples 1 to 7 presented in Table 1 are within the scope of preferred embodiments of the present invention. Of these samples 1 to 7, samples 2 to 5 include the nickel powder and the tin powder and meet the requirement that the volume of the tin powder is about 30% or more and about 70% or less based on the total volume of the nickel powder and the tin powder. Samples 2 to 5 are rated "○" for all the items given in Table 1: "Connection to inner electrode", "Adhesion to ceramic body", "Sintering in outer electrode", "Ejection of metal ball", and "Moisture resistance load reliability".

Sample 1, which is within the scope of the present invention but in which the volume of the tin powder is less than about 30% based on the total volume of the nickel powder and the tin powder, is rated "X" for "Sintering in outer electrode" and "Moisture resistance load reliability". However, the rating on "Sintering in outer electrode" is not particularly problematic in practical use. For "Moisture resistance load reliability", the samples are subjected to a rather harsh environment in the moisture resistance load test for evaluation. Thus, the reliability is also not particularly problematic in a normal operating environment.

Samples 6 and 7, which are within the scope of the present invention but in which the volume of the tin powder is more than about 70% based on the total volume of the nickel powder and the tin powder, are rated "X" for "Ejection of metal ball". The reason for this is presumably that the transformation of tin to a liquid phase occurred at about 850° C. because of the high tin proportion. However, this is not particularly problematic in practical use.

In the experimental examples described above, tin was used as a metal having a melting point of lower than about 500° C. Similar results have been obtained using a combination of tin and bismuth or a combination of tin, silver, and copper, in place of tin.

Although the multilayer ceramic capacitors have been described above as examples of the chip ceramic electronic components according to preferred embodiments of the present invention, the present invention can be applied to other chip ceramic electronic components as long as they include outer electrodes formed with conductive pastes.

It should be noted that each preferred embodiment described in the present specification is illustrative, and the components in the different preferred embodiments may be partially replaced or combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A chip ceramic electronic component, comprising:
   a ceramic body including an inner conductor and a portion of the inner conductor exposed on a surface of the ceramic body; and
   an outer electrode electrically coupled to the inner conductor and covering a portion of the surface of the ceramic body; wherein
   the outer electrode includes a glass-free sintered layer including nickel and a metal having a melting point of lower than about 500° C., the glass-free sintered layer including no glass; and
   a percentage of a thermosetting resin included in the glass-free sintered layer is about 1% or less in an area fraction in a cross section of the glass-free sintered layer.

2. The chip ceramic electronic component according to claim 1, wherein the metal having a melting point of lower than about 500° C. is at least one of tin, a combination of tin and bismuth, and a combination of tin, silver, and copper.

3. The chip ceramic electronic component according to claim 1, wherein the glass-free sintered layer is located on a portion of the surface of the ceramic body and in contact with the inner conductor.

4. The chip ceramic electronic component according to claim 1, wherein the chip ceramic electronic component is a multilayer ceramic capacitor.

5. The chip ceramic electronic component according to claim 1, wherein the outer electrode further includes a second glass-free sintered layer including no glass, the second glass-free sintered layer being disposed on the glass-free sintered layer.

6. The chip ceramic electronic component according to claim 1, wherein the outer electrode further includes a resin-containing conductive layer.

7. The chip ceramic electronic component according to claim 1, wherein the outer electrode further includes a glass-containing sintered layer including a glass.

* * * * *